(12) United States Patent
Ho et al.

(10) Patent No.: US 7,385,143 B2
(45) Date of Patent: Jun. 10, 2008

(54) THERMAL BONDING STRUCTURE AND MANUFACTURE PROCESS OF FLEXIBLE PRINTED CIRCUIT BOARD

(75) Inventors: Ya-Ting Ho, Hsin-Chu (TW); Li-Hui Chen, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 261 days.

(21) Appl. No.: 11/085,097

(22) Filed: Mar. 22, 2005

(65) Prior Publication Data

US 2006/0157853 A1 Jul. 20, 2006

(30) Foreign Application Priority Data

Jan. 14, 2005 (TW) .............................. 94101091 A

(51) Int. Cl.
*H05K 1/00* (2006.01)
(52) U.S. Cl. .................. 174/254; 174/258; 174/262
(58) Field of Classification Search ............. 257/269, 257/686, 691; 174/255, 254, 260; 361/398; 156/182
See application file for complete search history.

(56) References Cited

U.S. PATENT DOCUMENTS

| | | | | |
|---|---|---|---|---|
| 5,142,448 A | * | 8/1992 | Kober et al. ............... | 361/751 |
| 5,689,091 A | * | 11/1997 | Hamzehdoost et al. ..... | 174/255 |
| 6,465,882 B1 | * | 10/2002 | Cohn et al. ................. | 257/691 |
| 6,614,104 B2 | * | 9/2003 | Farnworth et al. .......... | 257/686 |
| 6,841,883 B1 | * | 1/2005 | Farnworth et al. .......... | 257/777 |
| 6,853,064 B2 | * | 2/2005 | Bolken et al. .............. | 257/686 |
| 6,946,325 B2 | * | 9/2005 | Yean et al. ................. | 438/112 |
| 2004/0035520 A1 | * | 2/2004 | Nakamura et al. .......... | 156/182 |

* cited by examiner

*Primary Examiner*—Tuan T. Dinh
*Assistant Examiner*—Andargie Aychillhum
(74) *Attorney, Agent, or Firm*—Rosenberg, Klein & Lee

(57) ABSTRACT

A thermal bonding structure and manufacture process of a flexible printed circuit (FPC) board are disclosed, and the thermal bonding structure includes a laminated structure having a first insulating layer with a solder pad area and showing parts of a first conductive layer, the first conductive layer, a second insulating layer, a second conductive layer, and a third insulating layer with a bonding area such that a part of the second conductive layer is exposed, and at least a through hole passing through the first conductive layer to the second conductive layer for propagating heat energy to fuse a solder. Accordingly, the reduction of heat energy lost in the third insulating layer improves the bonding quality, shortens the bonding period, and maintains the material stability under high temperature resulted from high heat energy.

13 Claims, 5 Drawing Sheets

THERMAL BONDING STRUCTURE AND MANUFACTURE PROCESS OF FLEXIBLE PRINTED CIRCUIT BOARD

FIELD OF THE INVENTION

The present invention generally relates to a flexible printed circuit board, and more particularly relates to a thermal bonding structure and manufacture process of a flexible printed circuit board that can improve the issues of bonding burns and material quality.

BACKGROUND OF THE INVENTION

As our living standard is improving gradually, various electronic consumer products are introduced to meet extensive consumer requirements, and thus promoting the prosperity of various industries directly and driving the growth of related sub-industries indirectly. To further meet the consumer requirements and trends for various functions, portability, operability and appearance, in hope of improving consumer's willingness to buy and brand loyalty, various electronic consumer products tend to be designed thinner and lighter. For example, the market share of color mobile phones with a photographic function and other combined functions grows drastically, and the demand of color LCD panels and camera modules for mobile phones rises accordingly. Color LCD panel industry is divided into the area of color super twisted nematic (CSTN) LCDs and thin-film transistor (TFT) LCDs, and the key components including light emitting diodes (LEDs) and flexible printed circuit (FPC) boards also grow with the high demand for flexibility, 3-D circuit layout and light weight of a miniaturized foldable design of mobile phones. The estimated quantity of flexible printed circuit boards used in a color mobile phone is increased from 3~4 pieces to 6~7 pieces, and the design of flexible printed circuit boards tends to follow a high-end small circuit specification. A flexible printed circuit board is made by raw materials including a flexible insulating substrate material and a circuit conductor material (generally copper clad), and the raw materials are divided into resins, copper clads, adhesives, coverlays, and flexible copper cladded laminates (FCCL). Since polyimide (PI) has good expansibility and heat resistance, therefore PI is generally used as a resin material and serves as a middle layer and a substrate in the manufacture of flexible copper substrates and also as a coverlay film.

PI manufacturers can produce different PI films from different PI monomers according to different technologies in three main aspects: formula, manufacture process and processing method, and thus different manufacturers achieve different applications and performance of the materials. Further, the flexible copper substrate is divided into two main types: an adhesive three-layer structure and an adhesiveless two-layer structure, and both adopt different manufacture processes, methods and applications, and thus the properties of the materials are different. In general, the adhesive three-layer structure is usually applied to the production of a large number of flexible printed circuit board products and the adhesiveless two-layer structure is usually applied to the manufacture of high-end flexible printed circuit boards, such as the rigid and flexible printed circuit boards and some of the multi-layer boards. It is believed that the adhesiveless two-layer structure will take over some of the adhesive three-layer flexible copper cladded laminates used for the flexible printed circuit boards with high resolution and good dimensional stability.

Referring to FIG. 1, a schematic view of the relation between the raw materials and the finished goods of a prior art flexible printed circuit board is illustrated. In the manufacture of the flexible printed circuit board 150, an insulating substrate material 100 and a circuit conductor material 110 are used to produce an adhesiveless two-layer flexible copper cladded laminate 130 first, and then a coverlay, a stiffener, and an anti-static layer are used to produce the flexible circuit board 150. On the other hand, an adhesive three-layer flexible copper cladded laminate 140 is made of an insulating substrate material 100, a circuit conductor material 110 and an adhesive 120, and a flexible printed circuit 150 is made of such laminate 140. At present, flexible printed circuit boards are generally used in electronic products, particularly mobile phones and LCDs showing a drastic a growth of using flexible circuit boards in their applications.

Referring to FIG. 2, a top view of a flexible printed circuit board and a cross-sectional view of a bonding head according to a prior art are illustrated. The flexible printed circuit board 2 comprises a first insulating layer 200, an adhesive layer 210, a conductive layer 220 and a second insulating layer; wherein the first insulating layer 200 and the second insulating layer 240 are made of the same material or different materials, and the first insulating layer 200 includes a solder pad area 270 and the second insulating layer 240 includes a bonding area 250, such that a bonding head 260 is in direct contact with the bonding area 250 for soldering the flexible printed circuit board 2 with another flexible printed circuit board. In actual practices, the boding area 250 is usually situated at a position substantially parallel to the solder pad area 270, so that heat energy can be conducted from the bonding area 250 to the adhesive layer 210, conductive layer 220 and solder pad area 270 for bonding. However, it is necessary to increase the temperature of the bonding head 260 for bonding, and the high temperature will burn the first insulating layer 200 and the adjacent adhesive layer 210 black, and thus causing poor bonding quality and appearance of the product, or even deteriorating the materials in the bonding area. For example, a bonding machine sets a temperature for the bonding head for a thermal compression, and the temperature of the bonding head is set to 330° C. for a predetermined time (such as 3 seconds for temperature rise) and then the operating temperature of the bonding machine is set to 470° C. for another predetermined time (such as 3.5 seconds for the bonding), then the solder will be fused to complete the bonding process. However, the first insulating layer 200 and its adjacent adhesive layer 210 will be burned black at the temperature of 470° C., and such phenomenon is particularly severe for lead-free solders because the melting point of lead-free solders is higher than that of lead solders. For example, the melting points of the solders of the Sn—Ag—Cu series and Sn—Cu—Ni series are 227° C. and 217° C. respectively. Compared with the melting point 183° C. of solder of the Sn—Pb series, there is a difference of 34~44° C. Therefore, it is necessary to increase the temperature of the bonding head 260 for lead-free solders in compliance with the environmental protection and international standard requirements. As a result, the burning effect produced in the bonding area 250 becomes obvious and severe.

Therefore, developing a thermal bonding structure and manufacture process for a flexible printed circuit board to overcome the foregoing shortcomings of the prior arts, improving the burning situation in the bonding area, and further conducting heat energy to the solder so as to lower the bonding temperature and supply less heat energy for saving bonding time and costs are important topics for manufactures and users and demand immediate attentions and feasible solutions. The inventor of the present invention based on years of experience on related research and development of the optoelectronic component industry to invent a thermal bonding structure and manufacture process for flexible printed circuit boards to overcome the foregoing shortcomings.

SUMMARY OF THE INVENTION

Therefore, it is a primary objective of the present invention to provide a thermal bonding structure of a flexible printed circuit board that comprises: a laminated structure and the laminated structure includes a first insulating layer, a first conductive layer, a second insulating layer, a second conductive layer and a third insulating layer in sequence; at least a through hole for passing through the first conductive layer, the second insulating layer and the second conductive layer. The first insulating layer includes a solder pad area for exposing the first conductive layer, and the third includes a bonding area for exposing the second conductive layer, such that the bonding head is in direct contact with the bonding area, and the heat energy can be conducted to the solder pad area through the through hole quickly for bonding.

Another objective of the present invention is to provide a flexible printed circuit board comprising a first area, and the first area includes a laminated structure having a first insulating layer, a first conductive layer, a second insulating layer, a second conductive layer and a third insulating layer arranged in sequence; a second area including a laminated structure coupled to the first area and having a first insulating layer, a first conductive layer, and a second insulating layer arranged in sequence; and a third area including a laminated structure disposed away from the first area and coupled to the second area and having the foregoing first insulating layer, first conductive layer, second insulating layer, second conductive layer and third insulating layer arranged in sequence; and at least one through hole passing through the foregoing first conductive layer, second insulating layer and second conductive layer. The first insulating layer in the third area includes a solder pad area for exposing the first conductive layer and being in contact with the solder, and the third insulating layer includes a bonding area for exposing part of the second conductive layer to define a bonding area, such that the heat energy of the bonding head can be conducted to the solder pad area through the through hole quickly to reduce bonding time and heat supply costs.

A further objective of the present invention is to provide a manufacture process of a flexible printed circuit board that comprises the steps of: providing a laminated structure and the laminated structure is divided into a first area, a second area and a third area, and the second area is disposed between the first area and the third area, and the laminated structure in the first and third areas includes a first insulating layer, a first conductive layer, a second insulating layer, a second conductive layer and a third insulating layer arranged in sequence, and the second area includes a first insulating layer, a first conductive layer, a second insulating layer, and at least one through hole formed in the first area and third area separately and passing through the first conductive layer, the second insulating layer and the second conductive layer; removing a part of the third insulating layer to expose the second conductive layer and define a bonding area; removing a part of the first insulating layer in the third area to expose the first conductive layer and define a solder pad area; and removing a part of the third insulating layer in the third area to expose the second conductive layer and define a bonding area.

Thus, the thermal bonding structure and manufacture process of a flexible printed circuit board in accordance with the present invention has the following advantages. Since the heat consumption at the insulating layer is reduced, therefore the bonding head can achieve the bonding effect with less heat energy and the cost for the bonding process can be lowered. Furthermore, the bonding head is applied to the bonding area, and the through hole is used to conduct heat energy to the solder pad area to accomplish the bonding process, and thus the temperature of the bonding head can be controlled to improve the burning phenomenon caused by the high temperature of the bonding head and occurred at the bonding area, so as to enhance the soldering process, the material quality, and the appearance of the product.

DETAILED DESCRIPTION OF THE PREFERRED EMBODIMENTS

To make it easier for our examiner to understand the objective of the invention, its innovative features and performance, a detailed description and technical characteristics of the present invention are described together with the drawings as follows.

Figure 1:
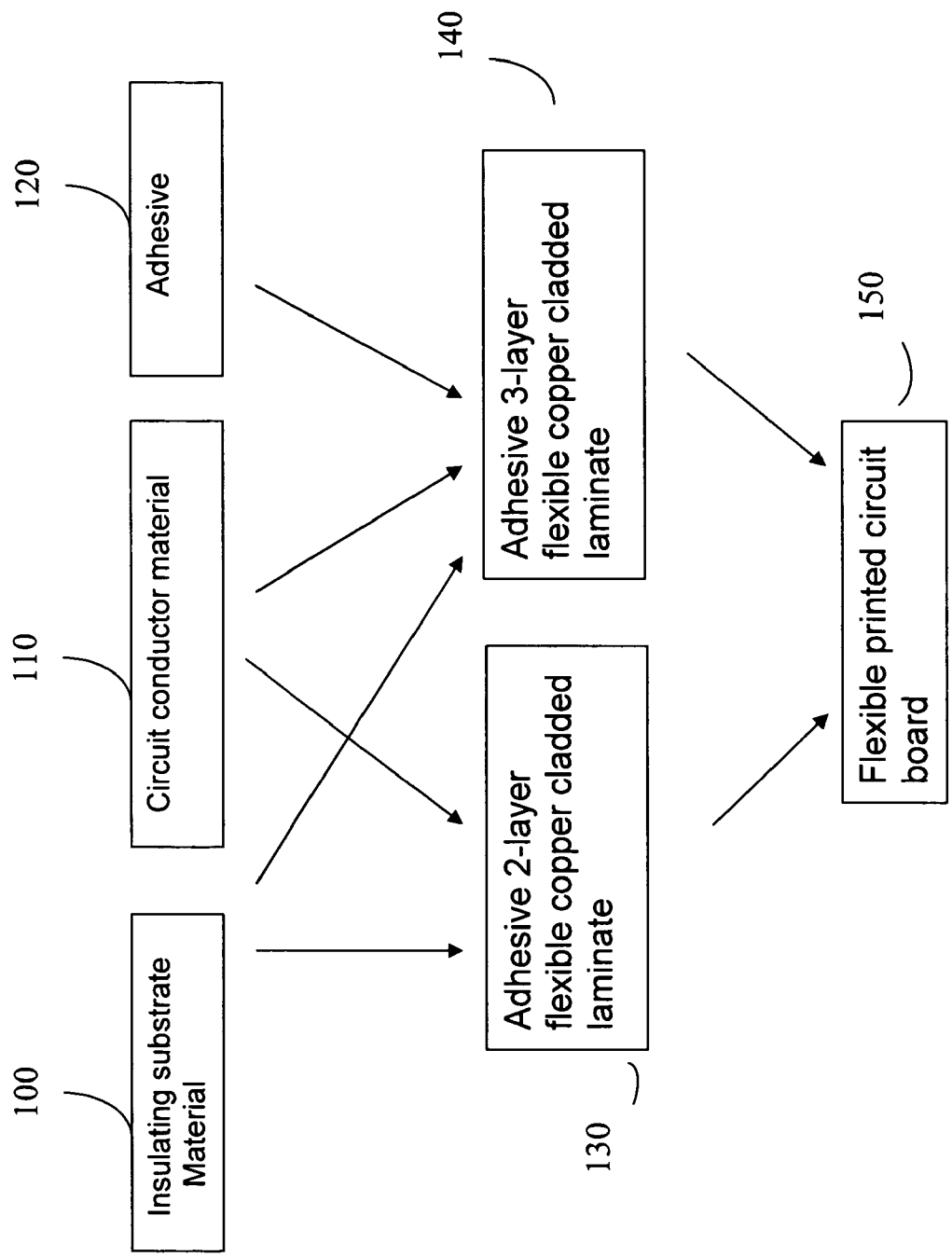
FIG. 1 is a schematic view of the relation between the raw materials and the finished goods of a prior art flexible printed circuit board.
Figure 2:
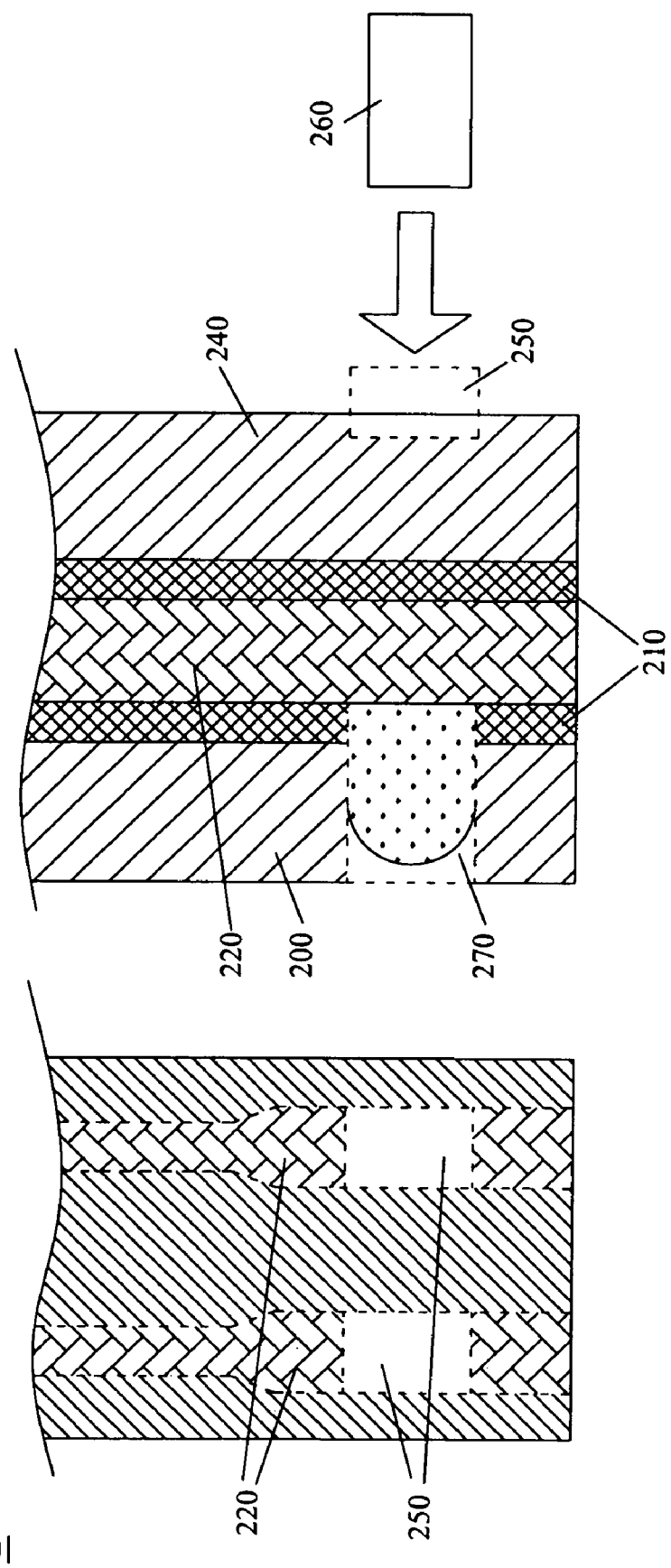
FIG. 2 shows a top view of a finished goods of a flexible printed circuit board and a cross-sectional view of a bonding head according to a prior art.
Figure 3:
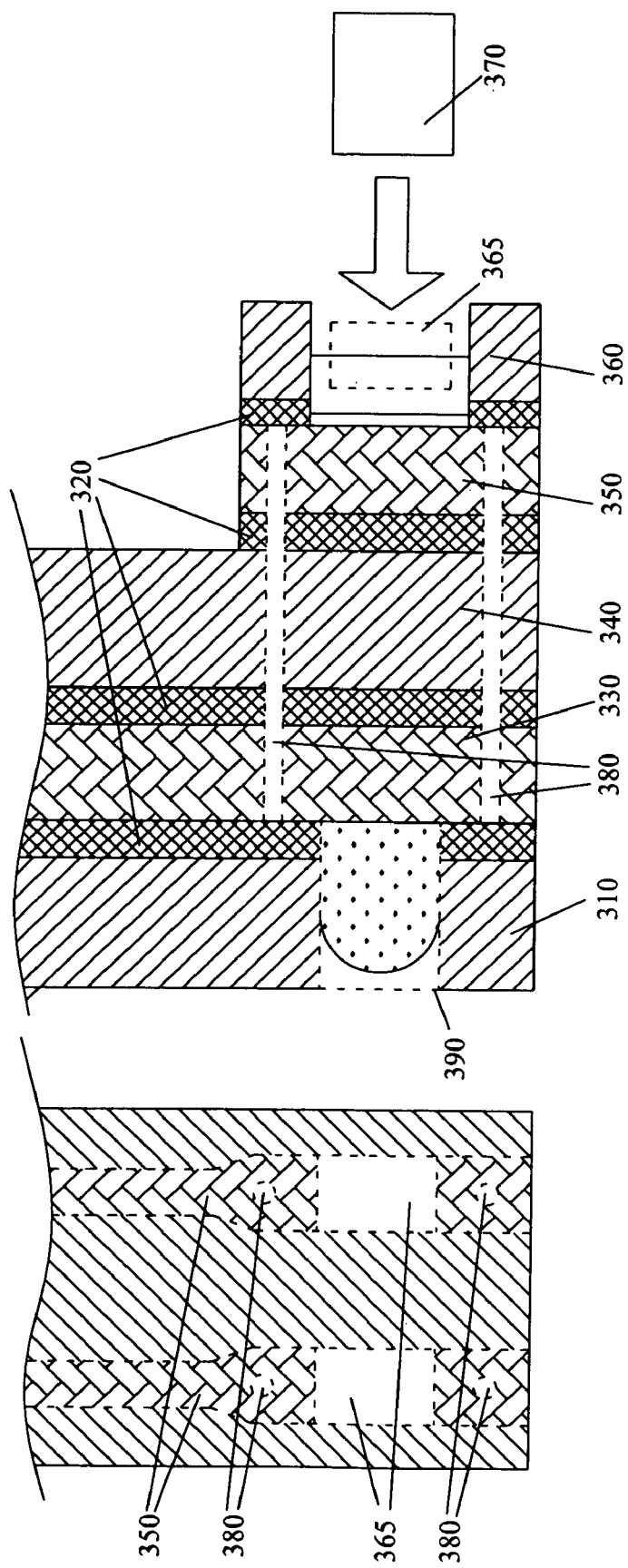
FIG. 3 shows a top view of a thermal bonding structure of a flexible printed circuit board and its corresponding cross-sectional view according to a preferred embodiment of the present invention.

Referring to FIG. 3, a top view of a thermal bonding structure of a flexible printed circuit board and its corresponding cross-sectional view according to a preferred embodiment of the present invention are illustrated. In the preferred embodiment, a thermal bonding structure 3 of a flexible circuit board comprises: a laminated structure having a first insulating layer 310, an adhesive layer 320, a first conductive layer 330, an adhesive layer 320, a second insulating layer 340, an adhesive layer 320, a second conductive layer 350, and a third insulating layer 360; and at least one through hole 380 passing through each layer between the first conductive layer 330 and the second conductive layer 350. The first insulating layer 310 includes a solder pad area 390 for exposing the first conductive layer 330, and the third insulating layer 360 includes a bonding area 365 for exposing the second conductive layer, and the through hole 380 is formed beyond the range of the solder pad area 390 and the bonding area 365. In other words, there is a gap between the solder pad area 390 and the bonding area 365. Referring to FIG. 3 for a cross-sectional view of a thermal bonding structure of a flexible printed circuit board according to a preferred embodiment of the present invention, the through hole 380 is formed beyond the range of the solder pad area 390 and the bonding area 365. It is noteworthy that each conductive layer can be stacked on top of each insulating layer directly as disclosed in another embodiment, since the laminated structure of the thermal bonding structure of the flexible printed circuit board can only have a first insulating layer 310, a first conductive layer 330, a second insulating layer 340, a second conductive layer 350 and a third insulating layer 360. The through hole 380 of this embodiment includes an electric conductive material on its internal wall, and the materials used for making the first conductive layer 330 and the second conductive layer include a copper clad, and the surface of the second conductive layer 350 of the bonding area 365 further includes a metal layer for protecting the second conductive layer 350. The metal layer could be single-layer or multiple-layer and made of gold, nickel, tin, other metal, or an alloy of the foregoing metals. In this embodiment, a nickel layer and a gold layer are formed in sequence on the surface of the second conductive layer 350 of the bonding area 365, and the materials used here are provided for the purpose of describing the present invention and not intended to limit the invention. Further, the quantity and size of the through holes 380 vary with the speed and time of the heat conduction, and thus the positions of the through holes and the bonding area described in this embodiment are provided for example only, and not limited to the same number and size of the through holes 380 as depicted in FIG. 3.

A lithographic etching is adopted to remove a part of the third insulating layer 360 to define a bonding area 365, so that heat energy can be conducted directly and quickly from the second conductive layer 350 to the first conductive layer 330 and fuse a solder such as a solder paste in the solder pad area 390. With the same conditions as the prior art, a solder can be fused to complete a bonding process with a lower temperature, if the temperature of the bonding machine is set to 330° C. for a predetermined time (such as 3 seconds for temperature rise) and the operating temperature of the bonding machine to 400° C.,and the bonding head 370 is operated for a bonding time (such as 3.5 seconds), and thus improving or avoiding the burning phenomenon at the bonding area 365 and the third insulating layer 360.

Figure 4:
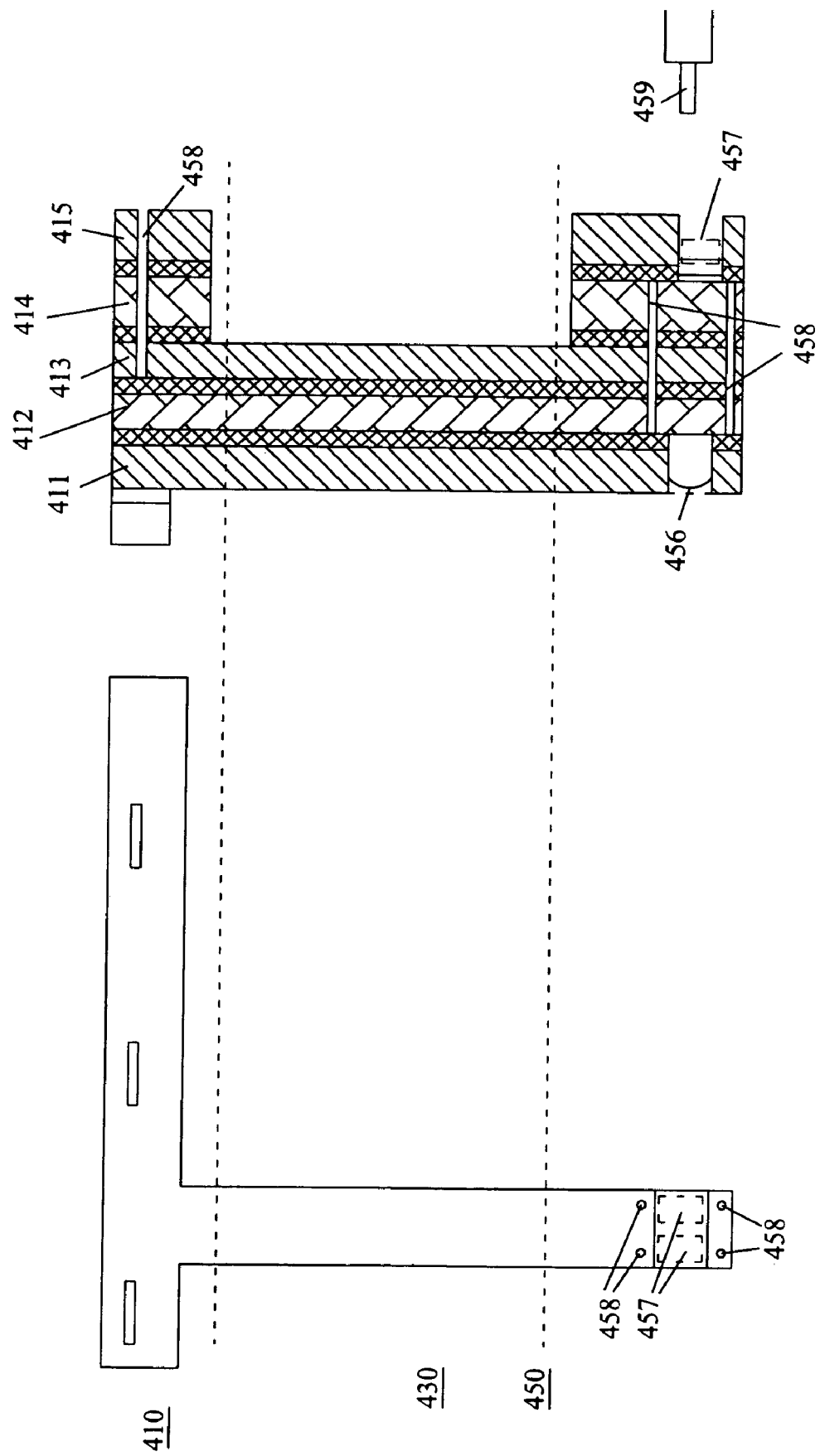
FIG. 4 shows a top view of a flexible printed circuit board and its corresponding cross-sectional view according to a preferred embodiment of the present invention.

Referring to FIG. 4, a top view of a flexible printed circuit board and its corresponding cross-sectional view according to a preferred embodiment of the present invention are illustrated. In this embodiment, the flexible printed circuit board 4 is divided into a first area 410, a second area 430 coupled to the foregoing first area 410 and a third area 450 disposed away from the first area 410 and coupled to the second area 430. The flexible printed circuit board 4 comprises a laminated structure, and the first area 410 (which is a connecting area for components such as the light emitting diodes) and the third area 420 include a first insulating layer 411, a first conductive layer 412, a second insulating layer 413, a second conductive layer 414 and a third insulating layer 415 arranged in sequence, and the second area 430 includes a first insulating layer 431, a first conductive layer 432, a second insulating layer 433 arranged in sequence and considered as a circuit area; and at least one through hole 458 passing through the first conductive layer 452, the second insulating layer 453 and the second conductive layer 454. The first insulating layer 451 in the third area 450 includes a solder pad area 456 for exposing the first conductive layer 452, and the third insulating layer 455 includes a bonding area 457 for exposing the second conductive layer 454 and contacting a bonding head 459. The surface of the second conductive layer 454 exposed from the bonding area 457 could include a metal layer, which is a single-layer metal layer such as a gold layer, or a double-layer metal layer such as a nickel layer and a gold layer. These materials are used for example to describe the present invention and not intended to limit the invention.

It is noteworthy that the through hole 458 is formed beyond the range of the solder pad area 456 and the bonding area 457, and the through hole 458 includes an electric conductive material such as nickel or any other substance having a thermal conductive property. In addition, the materials used for the first conductive layer 452 and the second conductive layer 454 could include a copper clad, and an adhesive layer could be included between layers.

Figure 5:
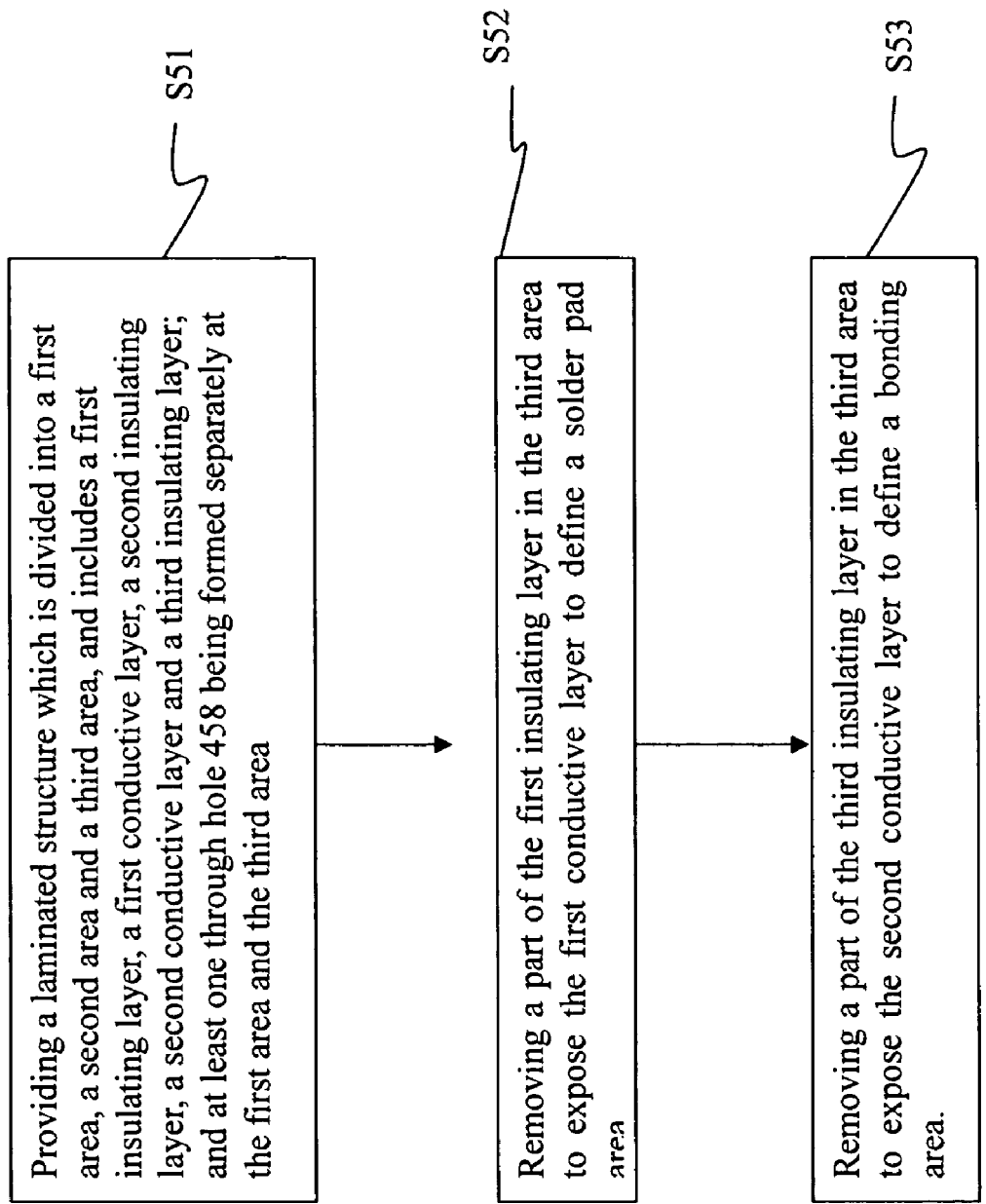
FIG. 5 shows a flow chart of the manufacture process of a flexible printed circuit according to a preferred embodiment of the present invention.

Referring to FIGS. 4 and 5, a flexible printed circuit board and a flow chart of a manufacture process of a flexible printed circuit board according to a preferred embodiment of the present invention are illustrated. In the embodiment, the manufacture process of a flexible printed circuit board 4 comprises the steps of: (Step S51) providing a laminated structure, which is a four-layer structure as shown in the figure, and the laminated structure is divided into a first area 410, a second area 430 and a third area 450, and the second area 420 is disposed between the first area 410 and the third area 450 and includes a first insulating layer 411, a first conductive layer 412, a second insulating layer 413, a second conductive layer 414 and a third insulating layer 415; and at least one through hole 458 being formed at the first area 410 and the third area 450 and passing through the first conductive layer 412, second insulating layer 413 and second conductive layer 414; (Step S52) removing a part of the first insulating layer 411 in the third area 450 to expose the first conductive layer 412 to define a solder pad area 456; and (Step S53) removing a part of the third insulating layer 415 in the third area 450 to expose the second conductive layer 414 to define a bonding area 457.

In another preferred embodiment of the present invention, a manufacture process of a flexible printed circuit board further comprises the steps of removing the second conductive layer 414 and the third insulating layer 415 in the second area 430, such that the laminated structure in the first area 410 and the third area 450 includes a first insulating layer 411, a first conductive layer 412, a second insulating layer 413, a second conductive layer 414 and a third insulating layer 415 arranged in sequence, and the laminated structure in the second area 430 includes a first insulating layer 411, a first conductive layer 412 and a second insulating layer 413 arranged in sequence; depositing an electric conductive material in at least one through hole 458 after forming at least one through hole 458 that passes through the first conductive layer 412, the second insulating layer 413 and the second conductive layer 414; and forming a metal layer on the surface of the bonding area 457 after forming the bonding area 457. It is noteworthy that the laminated structure further comprises at least one adhesive layer disposed between the first insulating layer, the first conductive layer 412, the second insulating layer 413, the second conductive layer 414 and the third insulating layer 415.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the description above, the present invention is novel and useful and definite enhances the performance over the conventional structure and further complies with the patent application requirements and is submitted to the Patent and Trademark Office for review and granting of the commensurate patent rights.

What is claimed is:

1. A bonding structure for a flexible printed circuit board, comprising:
   a first insulating layer;
   a first conductive layer laminated over the first insulating layer, wherein the first insulating layer has an opening formed therethrough exposing the first conductive layer to define a solder pad area thereat;
   a solder paste disposed on the solder pad area;
   a second insulating layer laminated over the first conductive layer;
   a second conductive layer laminated over the second insulating layer;
   at least one plated through hole formed through the first conductive layer, the second insulating layer, and the second conductive layer, the at least one plated through hole being adjacent to the solder pad area; and
   a third insulating layer laminated over the second conductive layer, the third insulating layer having an opening formed therethrough exposing the second conductive layer in aligned relationship with the solder pad area to define a bonding head receiving area thereat, whereby heat energy applied to the bonding head receiving area by a bonding head is conducted from the second conductive layer by the at least one plated through hole and the first conductive layer to the solder paste at the solder pad area.

2. The bonding structure of claim 1, wherein the first conductive layer and the second conductive layer are comprised of copper.

3. The bonding structure of claim 1, further comprising an adhesive layer disposed between the first insulating layer and the first conductive layer.

4. The bonding structure of claim 1, further comprising an adhesive layer disposed between the first conductive layer and the second insulating layer.

5. The bonding structure of claim 1, further comprising an adhesive layer disposed between the second insulating layer and the second conductive layer.

6. The bonding structure of claim 1, further comprising an adhesive layer disposed between the second conductive layer and the third insulating layer.

7. The bonding structure of claim 1, wherein the second conductive layer in said the bonding area comprises a metal layer disposed thereon.

8. A flexible printed circuit board, comprising:
   a first laminated portion having a first insulating layer, a first conductive layer, a second insulating layer, a second conductive layer and a third insulating layer laminated in sequence;
   a second laminated portion, coupled to the first laminated portion, having the first insulating layer, the first conductive layer and the second insulating layer laminated in sequence; and
   a third laminated portion, disposed away from the first laminated portion and coupled to the second laminated portion, having the first insulating layer, the first conductive layer, the second insulating layer, the second conductive layer, and the third insulating layer laminated in sequence, wherein the first insulating layer has an opening formed therethrough exposing the first conductive layer to define a solder pad area thereat, a solder paste being disposed on the solder pad area, at least one plated through hole being formed through the first conductive layer, the second insulating layer, and the second conductive layer, the at least one plated through hole being adjacent to the solder pad area, and the third insulating layer has an opening formed therethrough exposing the second conductive layer in aligned relationship with the solder pad area to define a bonding head receiving area thereat, whereby heat energy applied to the bonding head receiving area by a bonding head is conducted from the second conductive layer by the at least one plated through hole and the first conductive layer to the solder paste at the solder pad area.

9. The flexible printed circuit board of claim 8, wherein the first conductive layer and the second conductive layer are comprised of copper.

10. The flexible printed circuit board of claim 8, further comprising an adhesive layer disposed between the first insulating layer and the first conductive layer.

11. The flexible printed circuit board of claim 8, further comprising an adhesive layer disposed between the first conductive layer and the second insulating layer.

12. The flexible printed circuit board of claim 8, further comprising an adhesive layer disposed between the second insulating layer and the second conductive layer.

13. The flexible printed circuit board of claim 8, further comprising an adhesive layer disposed between the second conductive layer and the third insulating layer.

* * * * *